US006271542B1

(12) United States Patent
Emma et al.

(10) Patent No.: US 6,271,542 B1
(45) Date of Patent: *Aug. 7, 2001

(54) MERGED LOGIC AND MEMORY COMBINING THIN FILM AND BULK SI TRANSISTORS

(75) Inventors: Philip George Emma, Danbury, CT (US); Wei Hwang, Armonk; Stephen McConnell Gates, Ossining, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,066

(22) Filed: Dec. 8, 1997

(51) Int. Cl.[7] .............................. H01L 29/76; H01L 27/11
(52) U.S. Cl. ............................................. 257/67; 257/903
(58) Field of Search .......................... 257/66, 67, 68, 257/69, 70, 903, 904, 202, 204, 206, 211; 438/152, 153

(56) References Cited

U.S. PATENT DOCUMENTS

| | | | | |
|---|---|---|---|---|
| 5,006,913 | * | 4/1991 | Sugahara et al. | 257/67 |
| 5,198,683 | * | 3/1993 | Sivan | 257/67 |
| 5,266,511 | * | 11/1993 | Takao | 438/401 |
| 5,321,280 | * | 6/1994 | Sakai | 257/211 |
| 5,326,989 | * | 7/1994 | Muragishi | 257/67 |

FOREIGN PATENT DOCUMENTS

| | | |
|---|---|---|
| 47-16084 | 8/1972 | (JP). |
| 4-152566 * | 5/1992 | (JP). |
| 6-13576 | 1/1994 | (JP). |
| 9-45922 | 2/1997 | (JP). |

OTHER PUBLICATIONS

Lai et al., "Design and Implementaion of Differential Cascode Voltage Switch with Pass–Gate (DCVSPG) Logic for High–Performance Digital Systems", IEEE Journal of Solid–State Circuits, vol. 32, No. 4, Apr. 1997, pp. 563–573.

Lai et al., "Differential Cascode Voltage Switch with the Pass–Gate (DCVSPG) Logic Tree for High Performance CMOS Digital Systems", VLSITSA, 1993, pp. 358–362.

* cited by examiner

*Primary Examiner*—Steven Loke
*Assistant Examiner*—Hung Kim Vu
(74) *Attorney, Agent, or Firm*—McGuireWoods, LLP; Robert P. Tassinari, Jr.

(57) ABSTRACT

The present invention describes the use of two semiconductor layers, a thin film (TF) layer and a bulk Si wafer layer, to make high density and high speed merged logic and memory IC chips. The memory cells use three-dimensional (3D) SRAM structures. Two kinds of 3D logic cells are disclosed. 3D form of the differential cascode voltage switch (DCVS) architecture, and a 3D form of the DCVS with pass gate (DCVSPG) logic architecture. A high density "system on chip" architecture is described. The high density is achieved by locating large PMOS transistors in the TF Si layer, and the fast NMOS transistors in a bulk Si wafer layer. A single process sequence to simultaneously make the logic and memory circuits on the IC chip is also described.

11 Claims, 10 Drawing Sheets

MERGED LOGIC AND MEMORY COMBINING THIN FILM AND BULK SI TRANSISTORS

BACKGROUND OF THE INVENTION

1. Field of the Invention

The present invention generally relates to design and fabrication of merged logic circuits and memory arrays on a single semiconductor integrated circuit (IC) chip and, more particularly, to "system on chip" circuits and fabrication methods thereof in which logic circuits use two semiconductor levels, a thin film level and a bulk silicon (Si) level, and the memory array consists of static random access memory (SRAM).

2. Background Description

Increasing the density of logic circuits and memory arrays leads to faster circuit performance, smaller integrated circuits (ICs), and hence lower cost per IC. Presently, logic and memory functions are made on separate ICs and overall system speed is limited by communication bandwidth between logic and memory. The performance limit of about 500 MHz is due to communication bandwidth, and is a direct result of logic and memory functions communicating over relatively long distances (millimeters).

Also presently, the density of static random access memory (SRAM) arrays at integration levels of 16 megabit (Mb) and 64 Mb and higher is increased by locating four n-type metal oxide semiconductor (NMOS) transistors in the Si wafer level, and two p-type metal oxide semiconductor (PMOS) load transistors in a Thin Film (TF) polycrystalline Si (p-Si) layer above the Si wafer level. See, for example, A. K. Sharma, *Semiconductor Memories*, IEEE Press, New York (1997), and Y. Takao, H. Shimada, N. Suzuki, Y. Matsukawa, and N. Sasaki, *IEEE Transactions on Electron Devices* 39 (1992) p. 2147. The SRAM cell then requires a smaller Si wafer area. This is an example of three-dimensional (3D) integration to achieve higher density, and hence larger integrated SRAM arrays. In the 3D SRAM example, other benefits include increased noise immunity and low standby current, as particularly described by Sharma, supra.

On approach to reach beyond the performance limit of 500 MHz is integration of logic circuits and memory arrays on a single IC. These ICs are known as a "merged logic and memory", or a "system on chip" configuration. The system on chip configuration can enhance performance. Presently, two distinct process technologies are used to fabricate the distinct logic and memory chips.

What is needed is a solution to both density scaling and enhanced performance and also a single process technology to fabricate the logic and memory circuits.

SUMMARY OF THE INVENTION

It is therefore an object of the present invention to provide a compact and economical method to design and manufacture "system on chip" ICs.

It is another object of the invention to provide a single process technology and 3D integration method for both logic and memory circuits.

According to the invention, there is provided merged logic and memory ICs in which the logic circuits are fabricated in two semi-conductor levels, a thin film (TF) level and a bulk Si level. The logic circuits are a three-dimensional form of differential cascode voltage switch (DCVS) logic, in which the PMOS transistors are made in a thin film Si level located above the NMOS transistors, the latter being made in a bulk Si wafer level. This type of logic is described, for example, by L. G. Heller, W. R. Griffin, J. W. Davis, and n. G. Thoma, *Digest Tech. Papers, ISSCC* 1984, pp. 16–17, and by Fang-shi Lai and Wei Hwang, *IEEE Journal of Solid-State Circuits*, 32 (1997) p. 563. The memory array of this invention consists of static random access memory (SRAM), in which SRAM cell consists of two PMOS load transistors made in the aforementioned thin film Si level located above four NMOS driver transistors, which are located in the aforementioned bulk Si wafer level.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
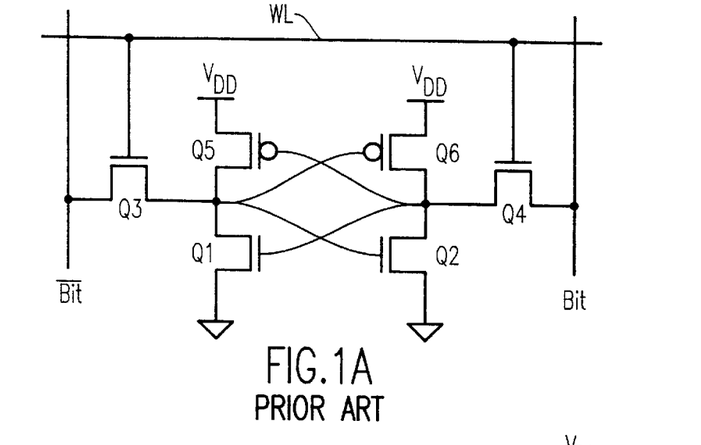
FIG. 1A is a schematic diagram and FIG. 1B is a plan view showing the prior art in planar SRAM cells.
Figure 1B:
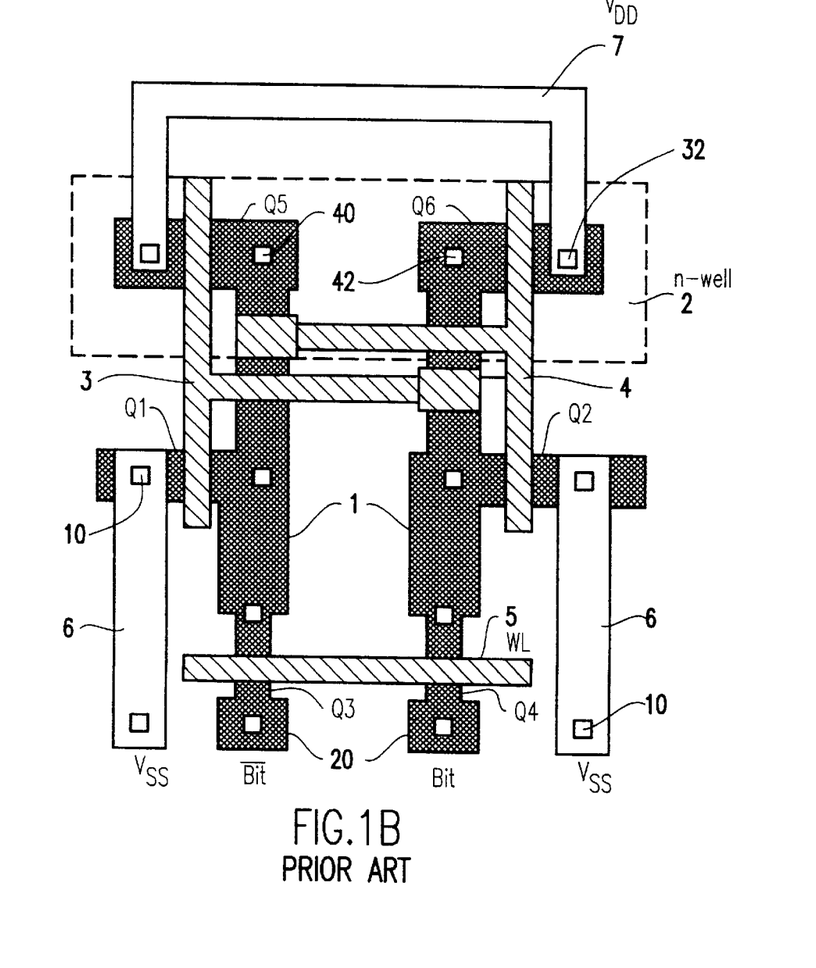

Referring now to the drawings, and more particularly to FIGS. 1A and 1B, there is shown an example of the prior art of a planar static random access memory (SRAM) arrays. FIG. 1A is a schematic circuit diagram illustrating a standard six transistor CMOS SRAM cell. The NMOS transistors Q1 and Q2 are the "access" devices, the NMOS transistors Q3 and Q4 are "driver" transistors, and the two PMOS transistors Q5 and Q6 are "load" transistors.

The layout plan view of a standard SRAM cell is shown in FIG. 1B. Q1 and Q2 NMOS transistors are formed by the overlap of the active n-silicon 1 and polysilicon layers 3 and 4. The source contacts 10 of Q1 and Q2 are contacted by metal layer 6 to $V_{ss}$ or ground. Similarly, Q3 and Q4 are formed by overlap of the active silicon 31 and polysilicon layer 5 which forms the word line (WL). The drain contacts 20 of Q3 and Q4 are connected to bitlines $\overline{Bit}$ and Bit, respectively. The PMOS Q5 and Q6 transistors are connected to metal layer 7 to $V_{DD}$. The drain contacts 40 and 42 of Q5 and Q6 are connected to the nodes, shown as solid dots in FIG. 1A.

Figure 2A:
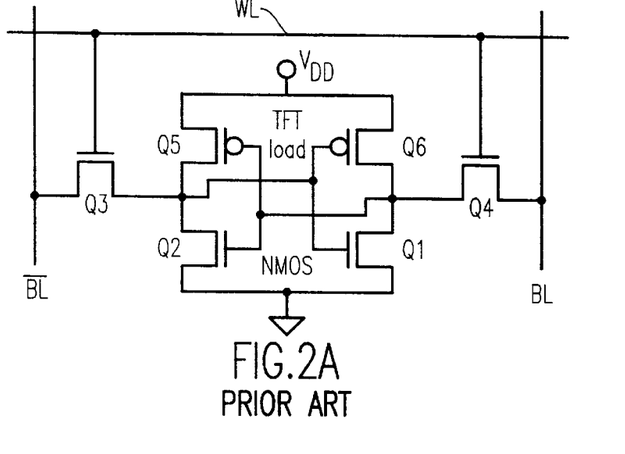
FIG. 2A is a schematic diagram and FIG. 2B is a cross-sectional view showing the prior art in three-dimensional SRAM cells.
Figure 2B:
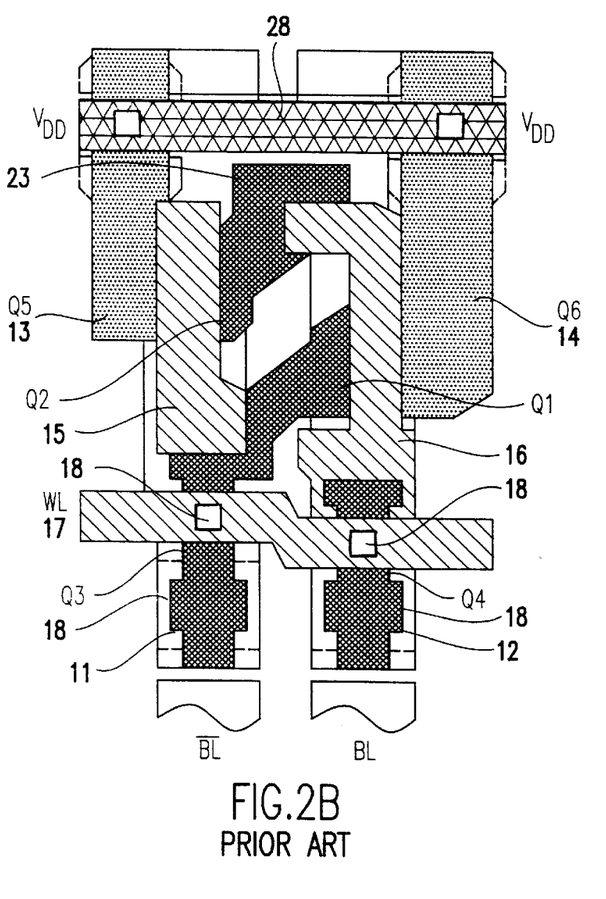

The prior art in SRAM cells fabricated in three-dimensions (3D) using thin film Si PMOS load transistors is shown in FIGS. 2A and 2B. The circuit of FIG. 2A is substantially the same as that of FIG. 1A.

FIG. 2B shows the structure of the prior art in three-dimensional (3D) SRAM cells, a fabrication method used to increase the density of memory arrays. The three-dimensional SRAM cell places the PMOS transistors, Q5 and Q6, in a thin film transistor (TFT) layer, preferably polycrystalline Si (p-Si) made by the excimer laser annealing method. Transistors Q1 to Q4 are made in the crystal Si wafer substrate. More particularly as shown in FIG. 2B, Q1 and Q2 NMOS transistors are formed by the overlap of the active n-silicon 21 and 23 and first polysilicon layers 16 and 15, respectively. Similarly, Q3 and Q4 are formed by the overlap of the active silicon 11 and 12 and first polysilicon layer 17 which forms the word line (WL). The drain contacts 18 of Q3 and Q4 are connected to the bit lines ($\overline{BL}$ and BL) which are formed in the aluminum (Al) metal layer. The second polysilicon layer 28 forms the gate of PMOS TFTs Q5 and Q6 (bottom gate TFT structure). The third polysilicon layers 13 and 14 forms the active layer of TFTs Q5 and Q6 and also forms the $V_{DD}$ line. The overlap of the second polysilicon layer 28 and third polysilicon layers 13 and 14 form the TFTs Q5 and Q6, respectively.

Differential cascode voltage switch (DCVS) logic is a double-rail CMOS circuit technique which has potential advantages over conventional single-rail NAND/NOR random logic in terms of layout area, circuit delay, power dissipation and logic flexibility. DCVS is constructed of stacked NMOS differential pairs which are connected to a pair of cross-coupled PMOS loads for pull up. No direct current (d.c.) is drawn in static mode. Therefore, complicated Boolean logic functions which may require several gates in conventional CMOS logic can be implemented in a single stage gate in DCVS.

Figure 3A:
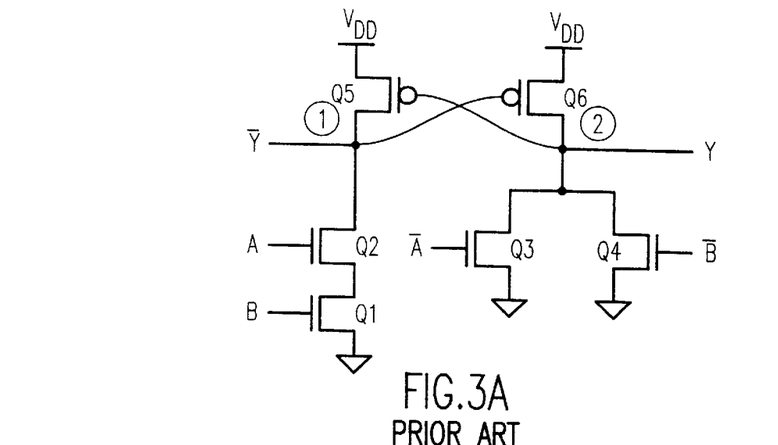
FIG. 3A is a schematic diagram and FIG. 3B is a plan view showing the prior art in conventional DCVS logic cells.
Figure 3B:
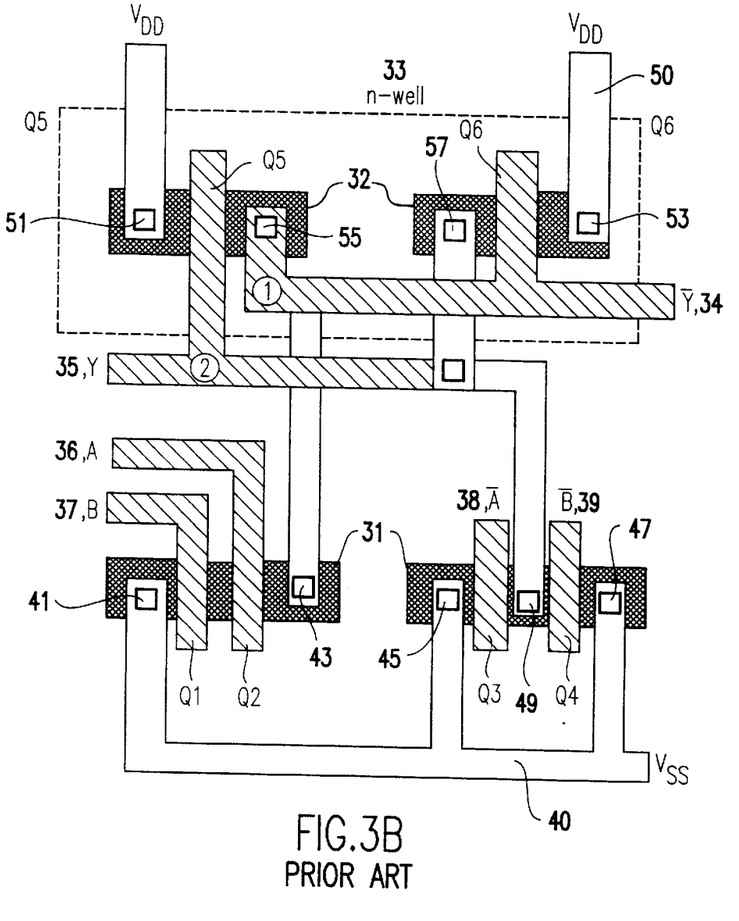

The prior art in a simple differential cascode voltage switch (DCVS) logic relevant to the present invention is shown in FIGS. 3A and 3B. The schematic circuit diagram of conventional DCVS AND/NAND gate is FIG. 3A, and the layout plan view is shown in FIG. 3B. In this case, all six transistors are made in a single level of the Si wafer substrate. There are four driver transistors, Q1 to Q4, which are NMOS devices and these form the n-channel logic evaluation (true and complement) trees. The circuit load is formed by two cross-coupled PMOS load transistors, Q5 and Q6, which are significant to the present invention because these devices occupy a large area of the Si wafer substrate and thus prevent the conventional DCVS logic from achieving very high area density.

In FIG. 3A, the left leg of NMOS logic tree is constructed of two NMOS transistors Q2 and Q1 in series and a connection to ground to form one pull-down network. Q2 and Q1 act as a switch which controlled by their gate signals A and B, respectively. The right leg of NMOS logic tree is constructed of two NNOS transistors Q3 and Q4 in parallel. Both transistors are connected to ground to form another pull-down network. Q3 and Q4 are controlled by their gate signals, complementary inputs $\overline{A}$ and $\overline{B}$, respectively. The pull-up network is constructed of two cross-coupled PMOS transistors, Q5 and Q6. When the input signals A and B swing from low to high, transistors Q1 and Q2 turn ON. The node $\overline{Y}$ is then discharged to ground. The node Y is floating at the transition period while the complementary input signals $\overline{A}$ and $\overline{B}$ swing from high to low.

Both of the NMOS transistors Q3 and Q4 are OFF. The ground level on the node $\overline{Y}$ turns the cross-coupled PMOS load transistor Q6 ON. The output node Y will be charged high. This realizes the dual AND/NAND logic functions.

The layout plan view of a simple DCVS AND/NAND gate is shown in FIG. 3B. Q1 and Q2 NMOS transistors are formed by the overlap of the active n-silicon 31 and polysilicon layers, 36 and 37. The source and drain diffusion is thereby self-aligned to the gates A and B. The source contact of Q1 is connected by metal layer 41 to $V_{SS}$ or ground. The drain contact of Q2, 43, is connected to node ① or $\overline{Y}$. Similarly, Q3 and Q4 NMOS transistors are formed by the overlap of the active silicon 31 and polysilicon layers, 38 and 39. The source and drain diffusion is thereby self-aligned to the gates $\overline{A}$ and $\overline{B}$. The source contacts of Q1, 45 and 47, are connected by metal layer 41 to $V_{ss}$ or ground. The shared drain contact of Q3 and Q4, 49, is connected to node ② or Y. Q5 and Q6 PMOS transistors are made in a p+ region implanted into n-well region 33. The n-well is usually a deeper implant compared with the transistor source/drain implants; therefore, it is necessary for the outside dimension to provide sufficient clearance between the n-well edges and adjacent n+ diffusion. Again, Q5 and Q6 PMOS transistors are formed by the overlap of the active p– silicon 32 and polysilicon layers, 34 and 35. The source contacts of Q5 and Q6, 51 and 53 are connected to metal layer 50 to $V_{DD}$. The drain contact of Q5 and Q6, 55 and 57, are connected to node ① and ②, or Y and $\overline{Y}$, respectively.

Figure 4:
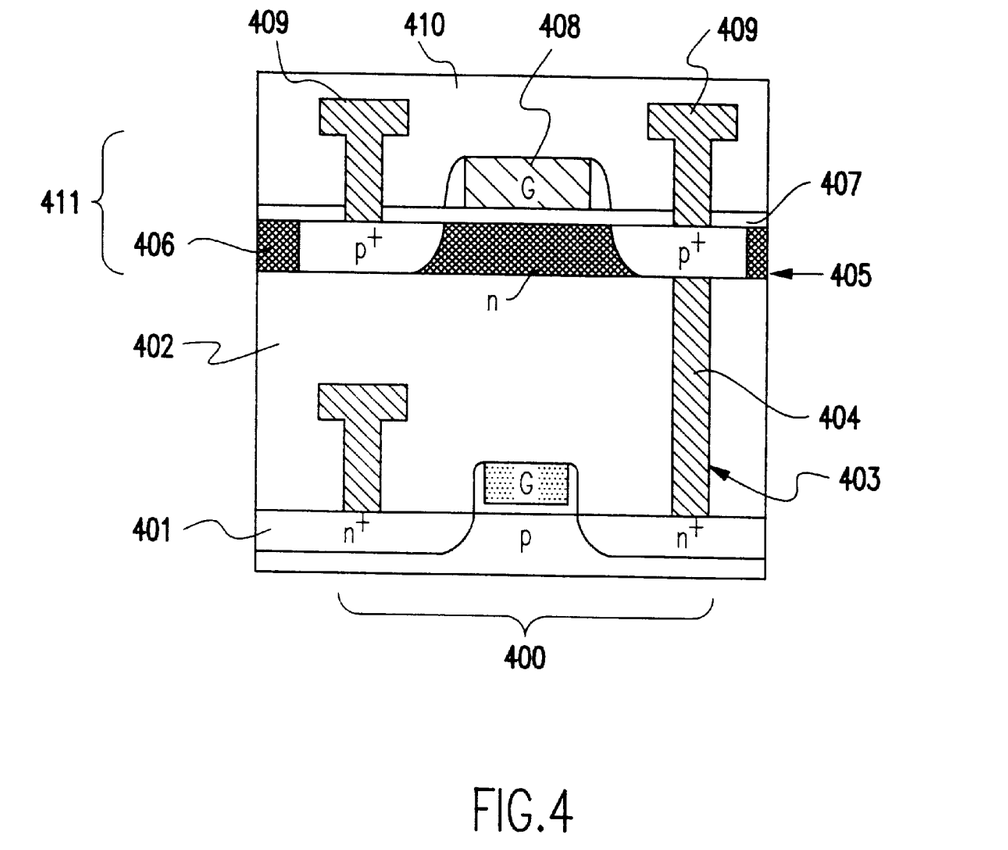
FIG. 4 is a cross-sectional view showing the three-dimensional construction of a complementary metal oxide semiconductor (CMOS) transistor pair according to the present invention.

A cross-sectional view of the structure illustrating the present invention is shown in FIG. 4. More particularly, FIG. 4 shows a schematic cross-section of the most general form of the present invention, a three-dimensional (3D) CMOS transistor pair used to form both logic and SRAM memory elements. For the sake of clarity, only the transistor levels are shown (wiring levels are not shown). In this simplified cross-section, a single NMOS transistor, 400, is made in the crystalline Si wafer substrate, 401. A PMOS load transistor, 411, is made in a Si layer above the NMOS device. The Si layer, 406, used for the PMOS TFT is preferably polycrystalline Si (p-Si) made by the excimer laser annealing method. Alternatively, this is p-Si made by the rapid thermal annealing (RTA) method. Briefly, lower parts of the structure are a thick insulator, 402, via holes, 403, and conductors, 404, filling the via holes.

The thick insulator, 402, is planarized by chemical mechanical polishing (CMP) methods to leave a flat surface, 405, for subsequent fabrication of the PMOS transistor 411. Upper parts of the structure are a thin film Si layer, 406, a gate dielectric layer, 407, a gate conductor, 408, and source and drain contacts 409. The source and drain metal level, 409, is insulated by the thick insulator (passivation) layer, 410. Fabrication of the thin film Si upper level of this structure is described in detail below in reference to FIGS. 8A to 8D.

Figure 5A:
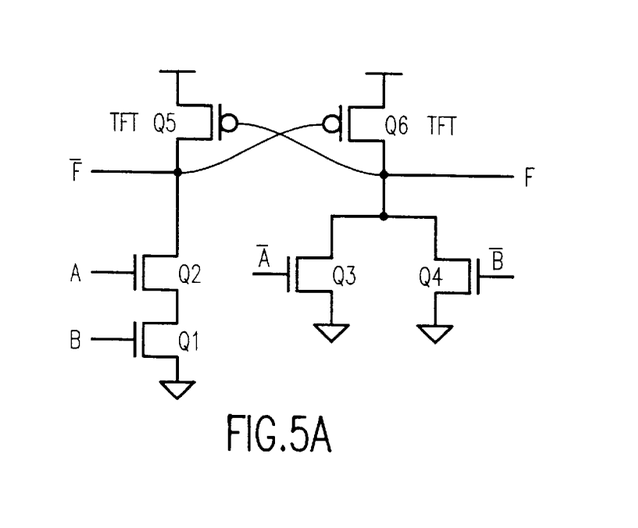
FIG. 5A is a schematic diagram and FIG. 5B is a cross-sectional view showing three-dimensional DCVS logic AND/NAND gates.
Figure 5B:
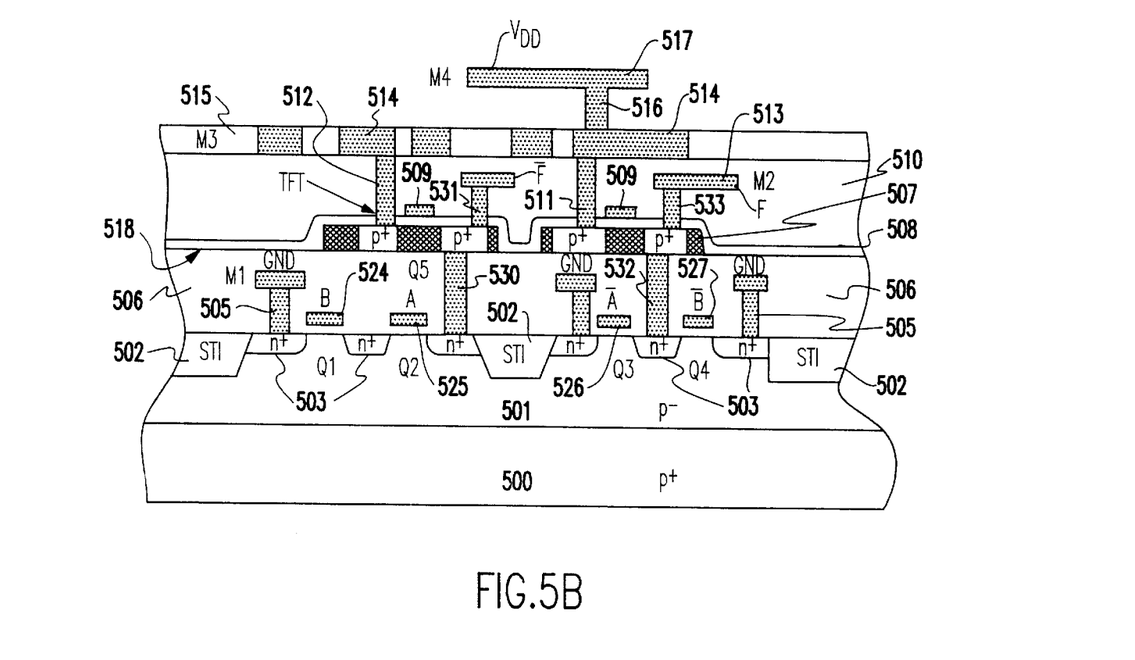

A general case and a preferred embodiment of the present invention is now described in reference to FIGS. 5A and 5B which show a detailed structure of one embodiment of the present invention, a 3D circuit construction of AND and NAND differential logic gates in DCVS logic. The DCVS circuit concept in its differential form is illustrated in FIG. 5A, which shows a circuit schematic diagram for both AND and NAND gates in DCVS logic (three-dimensional construction, or 3D DCVS). Again, for sake of clarity, only the transistor levels and selected wiring levels up to M4 are shown (complete wiring levels are not shown). Active transistors Q1 to Q4 are made in the crystal Si wafer substrate. The two cross-coupled PMOS road transistors Q5 and Q6 are made in a TFT layer, preferably using polycrystalline Si (p-Si) made by the excimer laser annealing method. Depending on the differential inputs, one output (either F or $\overline{F}$) is pulled down by the NMOS combinatorial logic evaluation tree network. Positive feedback action sets the PMOS latch to static output F and $\overline{F}$ or full differential $V_{DD}$ and ground logic levels.

The basic circuit operation of 3D DCVS is the same as 2D DCVS which was described above with reference to FIG. 3A. In the 3D case, the pull-up load network consists of two cross-coupled PMOS TFTs. This provides significant advantages in design flexibility for said load devices. The pull-up performance, i.e., a faster rise time, of a complex logic gate can be dramatically enhanced. It should be noted that the double-rail logic has been used exclusively in advanced high performance digital systems. The design procedure to construct a more complex NMOS logic tree for 2D or 3D DCVS can be synthesized by the Karnaugh map (K-map).

The detailed cross section showing fabrication of this circuit is in FIG. 5B. The p– epitaxial layer 501 is deposited on the p+ substrate 500. A standard NMOS process is used to make the active transistors Q1 to Q4 on the p+ substrate, 500. The active area 503 for transistors Q1 to Q4 is defined by ion implant of the N-dopant. Then the shallow trench isolation (STI), 502, isolates adjacent devices Q2 and Q3. A deposited polysilicon layer is patterned to form self-aligned Si gates, 524, 525, 526 and 527, of transistors Q1 to Q4, respectively. Ion implantation is used to form the N-doped source and drain regions, 503. The source and drain contacts 505 are formed and connected to the first metal layer (M1). The source junction contacts of transistors Q1, Q3 and Q4 are connected to M1, ground. The transistor gates of Q1, Q2, Q3, and Q4 are connected to input signals A, B and $\overline{A}$, $\overline{B}$, respectively. A thick insulator, 506, is deposited by chemical vapor deposition (CVD). As mentioned previously, the thick insulator, 506, is planarized by chemical mechanical polishing (CMP) methods to leave a flat surface, 518, for subsequent fabrication of the PMOS load transistors.

Important via holes for connections between the bulk NMOS transistors and PMOS thin film transistors (TFTs) are then patterned and etched. These via holes are filled with the conductors, 530 and 532. Conductor 530 connects Q2 to Q5. Conductor 532 connects Q3 and Q4 to Q6.

PMOS load transistors are made in a TFT Si layer, preferably polycrystalline Si (p-Si) made by the excimer laser annealing method. The structure begins with deposition of the thin film Si layer, and patterning into active islands 507. The conformal deposited gate insulator layer 508 is made. Next, deposit highly doped polysilicon layer to form self-aligned silicon gate, 509. Ion implantation is used to form the P-doped source and drain regions. The source and drain contacts are connected to the M2 or M3 metal layers. The drain contact 531 of TFT Q5 is connected to metal layer M2, forming node $\overline{F}$. The drain contact 533 of TFT Q6 is connected to metal layer M2, forming node F. These nodes are connected to output signal lines $\overline{F}$ and F, respectively. Furthermore, the source contact 512 of TFT Q5 and contact 511 of TFT Q6 are connected to M3 layer, 514 and then through via 516 to the fourth metal layer (M4), 517. $V_{DD}$ is applied from thin film wire 514 through interconnect 511 to TFT Q6. $V_{DD}$ is applied from thin film wire 514 through interconnect 512 to TFT Q5. Deposited dielectric layers 510 and 515 isolate thin film wire levels. Only essential wire levels are shown. Only one of the wiring levels located above $V_{DD}$ 514 is shown. Standard VLSI technology is used to form the remaining back end of the line connections.

Figure 6A:
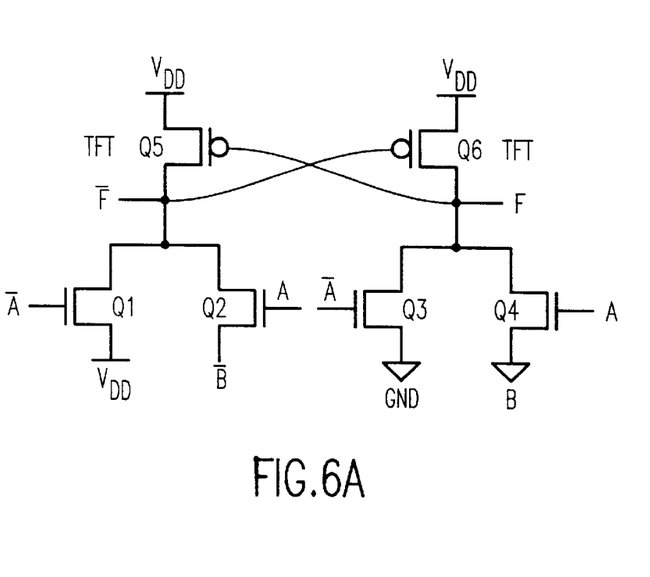
FIG. 6A is a schematic diagram and FIG. 6B is a cross-sectional view showing the specific case of logic AND/NAND gates made with 3D DCVSPG (pass gate) logic.
Figure 6B:
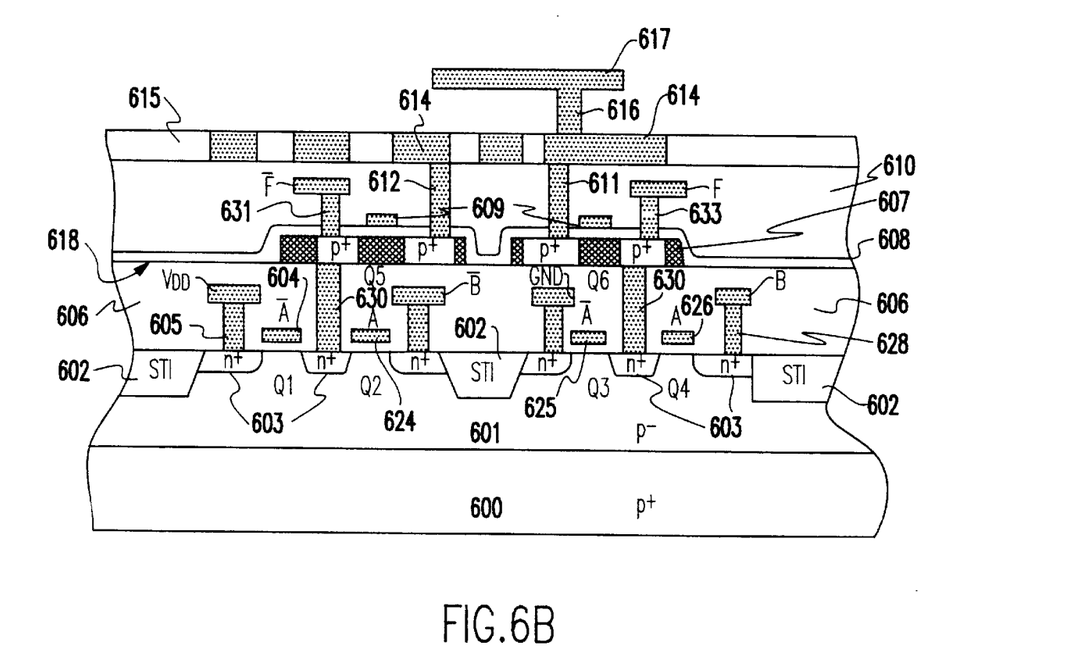

A specific case and a preferred embodiment of the present invention is now described in reference to FIGS. 6A and 6B. A new high-performance and low power circuit technique called 3D-differential cascode voltage switch with pass-gate (DCVSPG) logic family is described. The circuit style is designed using pass-gate logic tree in DCVSPG instead of the NMOS logic stacked tree in DCVS. The DVCS is classified as a ratio circuit. The DCVSPG is considered as a ratioless circuit. FIG. 6A is the circuit diagram for a simple AND/NAND gate made using DCVSPG logic in a three-dimensional structure.

In FIG. 6A, the left-side leg of the pass-gate the logic tree is constructed of two NMOS Q2 and Q1 in parallel. Note that in DCVS these two NMOS transistors are in series (FIG. 5A), but in DCVSPG these two NMOS transistors are in parallel. The advantages will be obvious when complex logic functions are designed (see FIGS. 7A to 7D). The right-hand leg of the pass-gate tree is constructed of two NMOS Q3 and Q4 in parallel as well. The pass-gate logic tree can be synthesized in a very systematic way by recursively using a Karnaugh map. The basic logic with two input variables A and B is shown in FIG. 6A. The input signal A or B can be either the NMOS gate control or NMOS source connection. In this case, if we assume the signal A is the control variable, the B signal will be the function variable. The control variable is used to connect to the gate and the function variable is connected to the source of the NMOS device. Under the control signals $\overline{A}$ and A, we grouped the terms together as shown in FIG. 6A. $\overline{A}$ connects to the control gates of both Q1 and Q3. A connects to the control gates of both Q2 and Q4. The source of Q1, Q2, Q3 and Q4 are connected to the functional variables $V_{DD}$ $\overline{B}$, ground and B, respectively. Two cross-coupled TFT PMOS transistors, Q5 and Q6, make up the pull-up network, exactly as in Figure 5A.

The 3D DCVSPG AND/NAND circuit shown in FIG. 6A actually solves the floating node problem by replacing the NMOS tree with the pass-gate design. With the same previous state, when both input signals A and B swing from low to high, Q2 and Q4 both turn ON. The node $\overline{F}$ is then discharged into ground when the complementary signals $\overline{A}$ and $\overline{B}$ swing from high to low. However, the output node F is charging up to high sate immediately. This realizes the dual AND/NAND logic functions. No floating node problems occur.

FIG. 6B is the detailed cross-section of the structure implementing the circuit of FIG. 6A. For sake of clarity, only the transistor levels and selected wiring levels up to M4 are shown (complete wiring levels are not shown). The detailed fabrication of this circuit is very similar to FIG. 5B. The only modification is the transistor connection scheme. In FIG. 6A, the left-side leg of NMOS network is now a parallel connection. The p–epitaxial layer 601 is deposited on the p+ substrate 600. A standard NMOS process is used to make the active transistors Q1 to Q4 on the p+ substrate, 600. The formation of this structure was described above with reference to FIG. 5B. The shallow trench isolation (STI), 602, isolates adjacent devices Q2 and Q3. A deposited polysilicon layer is patterned to form the self-aligned silicon gates, 604, 624, 625 and 626. Ion implantation is used to form the N-doped source and drain regions, 603.

The four following connections are made using the first metal layer (M1). The source junction contacts of transistors Q1 and Q2 are applied to $V_{DD}$ and $\overline{B}$, respectively. The source junction contacts of transistors Q3 and Q4 are applied to ground and B, respectively. These connections are made using the deposited polysilicon layer. The transistor gate of Q1, 604, and the transistor gate of Q3, 625, are connected to input signal $\overline{A}$. The transistor gate of Q2 is connected to input signal A, and the gate of Q4 is also connected to input signal A. Then, a thick insulator, 606, is deposited by CVD. As mentioned previously, the thick insulator, 606, is planaraized by chemical mechanical polishing (CMP) methods to leave a flat surface, 618, for subsequent fabrication of the PMOS load transistors. Via holes are patterned and etched, and the conductors, 630, are deposited filling via holes.

Again, the formation of the TFTs Q5 and Q6 can be followed beginning with the active area for transistor islands 607. Then deposit the thin insulator gate dielectric layer 608. Next, deposit a highly doped polysilicon layer to form self-aligned silicon gate, 609. Ion implantation is used to form the P-doped source and drain regions using the gate 609 as a self-aligned mask. The drain contacts of TFTs Q5 and Q6, 63 and 632, are connected to output signal line $\overline{F}$ and F, respectively, using the second metal layer (M2). Furthermore, the source contacts of TFTs Q5 and Q6, 612 and 611, are connected to the third metal layer (M3) layer, 614. A connection of M3 to the fourth metal layer (M4), 617, is shown as stud 616. $V_{DD}$ is applied from thin film wire 614 through interconnect 611 to TFT Q6. $V_{DD}$ is applied from thin film wire 617 through interconnect 616 to TFT Q6. Deposited dielectric layers 610 and 615 isolate the thin film wire levels. Only essential wire levels are shown. Only one of the wiring levels located above $V_{DD}$ 614 is shown. Standard VLSI technology is used to form the remaining back end of the line connections.

Figure 7A:
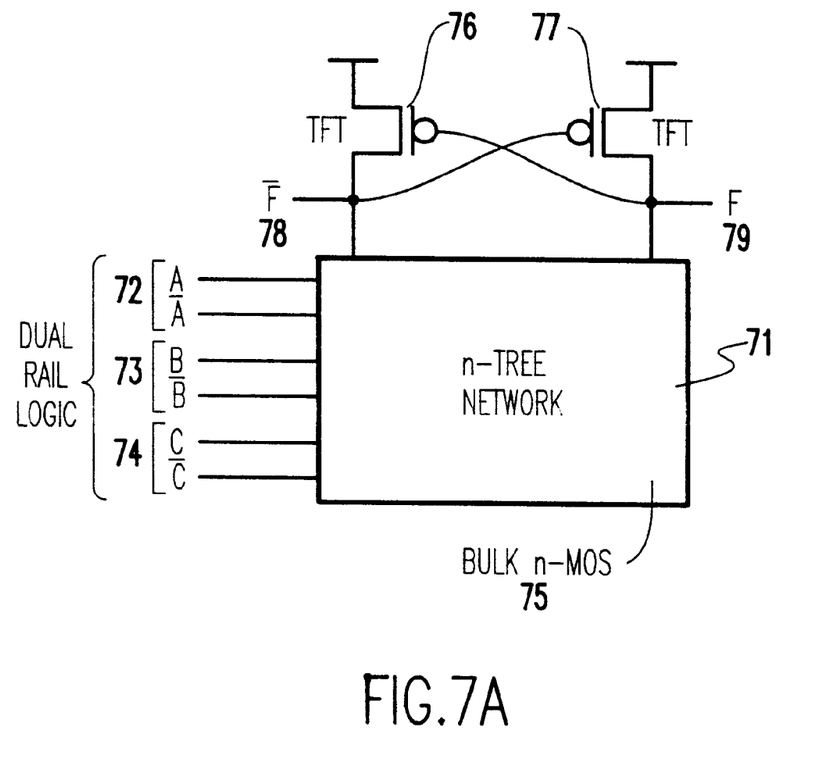
FIG. 7A is a block and schematic diagram showing the general case of n-Tree logic made with 3D DCVS logic.
Figure 7B:
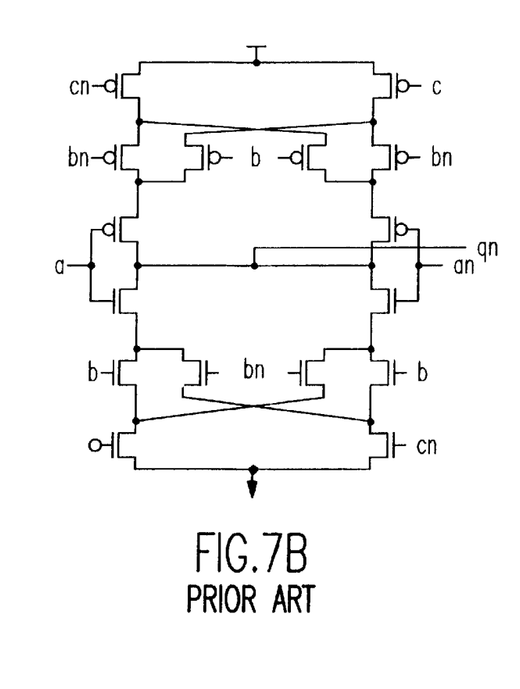
FIG. 7B is a schematic diagram showing the conventional (2D) case of a static CMOS sum circuit made with DCVS logic.
Figure 7C:
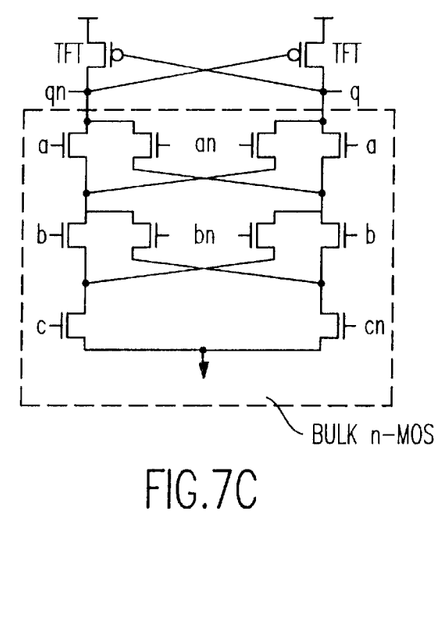
FIG. 7C is a schematic diagram showing the three-dimensional (3D) case of a DCVS sum circuit using two PMOS thin film transistors (TFTs) and ten NMOS crystal Si transistors.
Figure 7D:
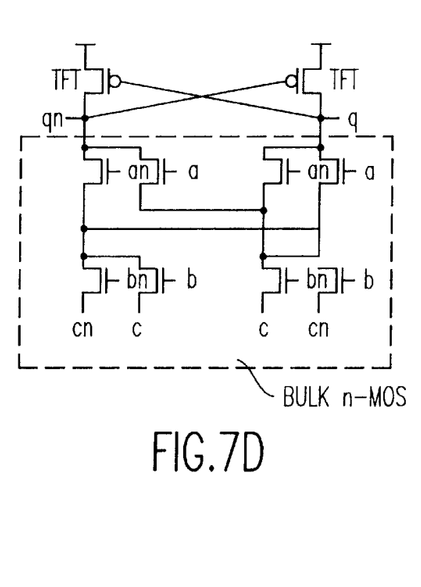
FIG. 7D is a schematic diagram showing the three-dimensional (3D) case of a DCVSPG sum circuit, using two PMOS TFTs and eight NMOS crystal Si trinsistors.

The most general form of the present invention is now described in reference to FIG. 7A which shows a general form of the present invention comprising a logic gate with multiple differential (dual rail) inputs, forming a combination logic network. Two cross-coupled PMOS TFTs 76 and 77 are at the top. Logic design leverage is achieved by DCVS or DCVSPG by cascading differential pairs of NMOS devices into the powerful combinatorial logic tree networks capable of processing complex Boolean logic functions. Therefore, complicated logic which may require several gates in conventional CMOS can be implemented in a single stage gate in DCVS or DCVSPG. For example, as shown in FIGS. 7B, a logic sum circuit can be implemented with sixteen transistors (eight PMOS and eight NMOS transistors) in conventional CMOS circuit. On the other hand, in DCVS twelve transistors (two PMOS and ten NMOS transistors), as shown in FIG. 7C, and in DCVSPG, ten transistors (two PMOS and eight NMOS transistors) make the logic gate circuit, as shown in FIG. 7D.

Combinatorial logic devices can be designed with unstacked PMOS devices used sparingly as pull-up devices in load and buffer circuitry. Optimization of the PMOS devices and optimization of the PMOS to NMOS spacing can therefore be relaxed, relieving the device and process complexity burden for DCVS design.

Figure 8A:
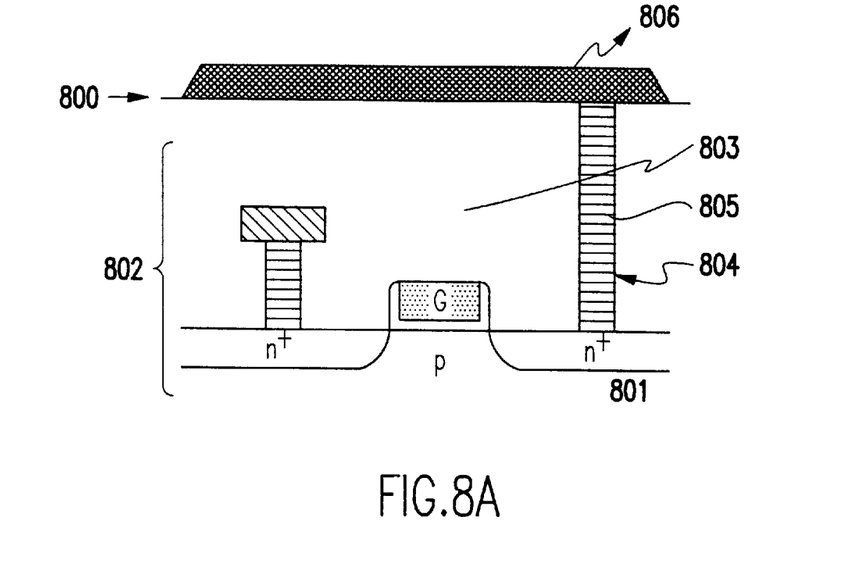
FIGS. 8A to 8D are cross-sectional views showing the process sequence for the thin film transistor (TFT) level used in both the 3D SRAM and 3D DCVS logic circuits.

The single set of process steps to make both logic and memory structures according to the present invention is now described in detail in reference to FIGS. 8A to 8D which show the general flow of process steps to make the Thin Film Transistor (TFT) PMOS levels of the present invention. We begin by assuming a level of completed NMOS transistors, 802, is existing on the Si wafer substrate, 801. A thick insulator, 803, is deposited and planarized by chemical mechanical polishing (CMP). This provides a smooth starting surface 800 for TFT fabrication. Via holes, 804, are patterned lithographically, etched, and filled with a conductor to form the interlevel connect, 805. This is preferably a refractory metal, for example tungsten. After planarization of the connect, 805, a layer of amorphous Si (about 500–1000 Angstroms (Å) thick) is deposited by a suitable method (sputtering, plasma enhanced CVD, or LPCVD), patterned lithographically into islands, and converted to p-Si. Excimer laser annealing (ELA) is the preferred method to crystallize the TF Si, although rapid thermal annealing (RTA) may be used. FIG. 8A shows the resulting poly-Si island, 806.

Figure 8B:
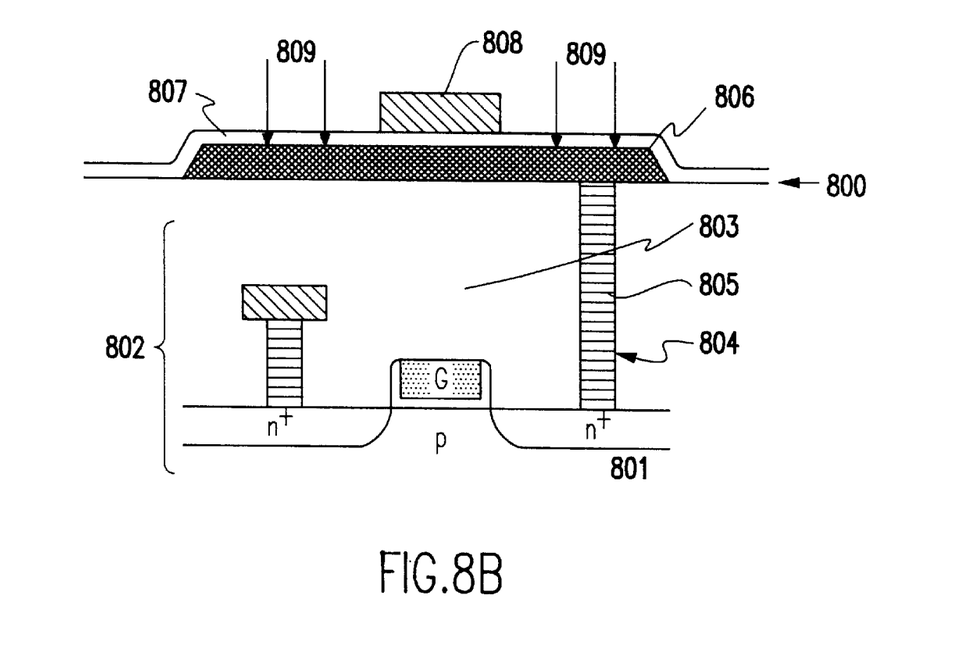

FIG. 8B shows deposition of the gate dielectric, 807, which is preferably amorphous $SiO_2$ about 1,000 to 1,500 Å thick, and is deposited by chemical vapor deposition (CVD) at a temperature of 300 to 400° C. The gate electrode is deposited as a blanket metal layer (aluminum, or other metal), and patterned lithographically to form the gate, 808. The P-type dopant boron, 809, is placed in the TF Si layer, 806, using ion implantation or ion shower doping. The energy of the B+ ions is selected so the ions penetrate through the dielectric, 807, and into the TF Si layer, 806. The gate, 808, may be used to mask the layer where no dopant is placed, so the gate may be a self aligned mask. Optionally, a two step doping procedure may be used to form a lightly doped drain structure. Then, the structure is heated for a few seconds by the RTA or the ELA methods to activate the dopant boron atoms.

Figure 8C:
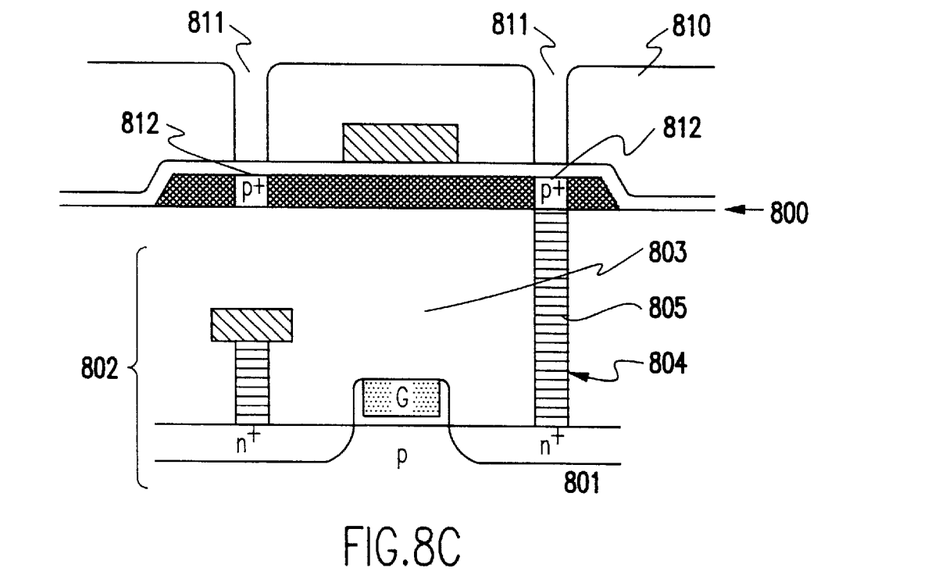

FIG. 8C shows deposition of a thick insulator, 810, which is amorphous $SiO_2$ or silicon nitride deposited by chemical vapor deposition. Via boles, 811, are patterned and etched to contact the source and drain regions of the TFT, 812.

Figure 8D:
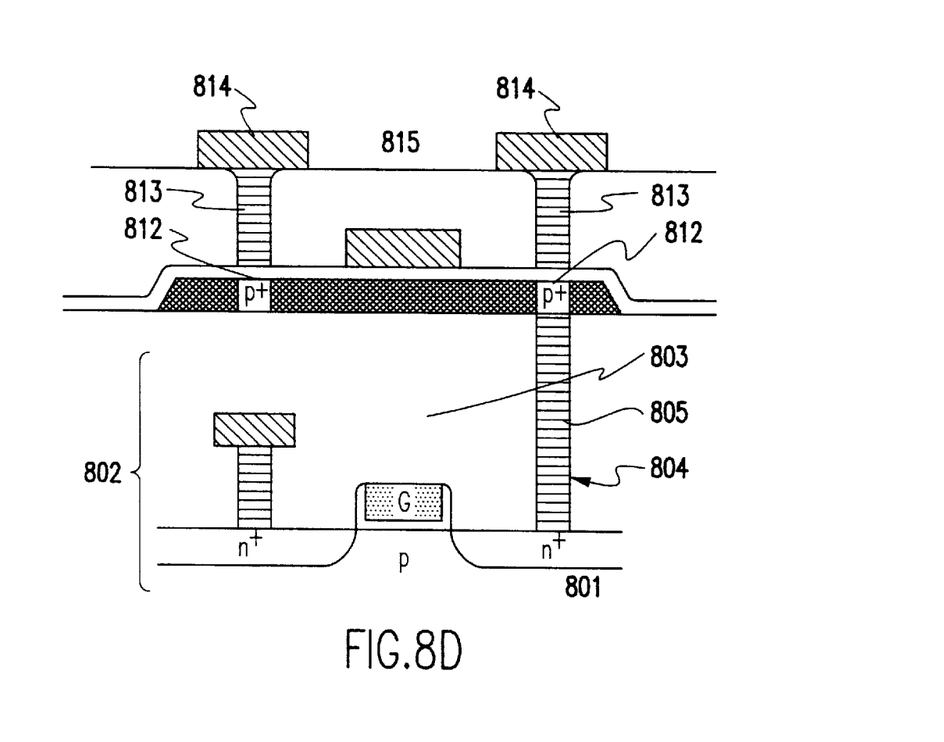

FIG. 8D shows deposition of conductors, 813, filling the via holes, 811. The preferred material is a aluminum, although other metals can be used. A source/drain metal level, 814, is deposited and pattered into thin film wires (the TFT source/drain metal level). Finally, a passivating insulator, 815, is deposited. The wiring levels, 814, are not shown in detail because we emphasize here the circuit diagrams and the TFT layer. The essential wiring levels are shown in FIGS. 5B and 6B.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A plurality of transistors made in two distinct semiconductor levels, a bulk silicon (Si) and a thin film Si level, in a single integrated circuit (IC) chip, each said transistor being in a single one of said levels and connected to form logic circuits in selected regions of the IC chip and to form static random access memory (SRAM) arrays in the remaining regions of the IC chip, wherein said logic circuits and said memory devices are logically interconnected, said selected regions being arbitrarily selectable in blocks as small as six transistors.

2. The plurality of transistors made in two distinct semiconductor levels as in claim 1 with p-type metal oxide semiconductor (PMOS) load devices made in the thin film Si level and n-type metal oxide semiconductor (NMOS) driver devices made in the bulk Si level.

3. The plurality of transistors made in two distinct semiconductor levels as in claim 1 wherein the transistors connected to form logic circuits are constructed as differential cascode voltage switch (DCVS) logic.

4. The plurality of transistors made in two distinct semiconductor levels as in claims 3 with the transistors connected to make complex Boolean logic function elements in an n-Tree network.

5. The plurality of transistors made in two distinct semiconductor levels as in claim 1 wherein the transistors connected to form logic circuits are constructed as differential cascode voltage switch with pass gate (DCVSPG) logic.

6. The plurality of transistors made in two distinct semiconductor levels as in claims 5 with the transistors connected to make complex Boolean logic function elements in an n-Tree network.

7. The plurality of transistors made in two distinct semiconductor levels as in claim 1 wherein the two Si levels are isolated by a dielectric layer that is planarized by chemical mechanical polishing (CMP) prior to fabrication of the thin film Si layer.

8. The plurality of transistors made in two distinct semiconductor levels as in claim 1 with p-type metal oxide semiconductor (PMOS) transistors made in a thin film Si level located above n-type metal oxide semiconductor (NMOS) transistors which are made in the bulk Si level, and with the thin film Si level made by the excimer laser annealing (ELA) method.

9. The plurality of transistors made in two distinct semiconductor levels as in claim 1 wherein the memory devices are formed in a memory array.

10. The plurality of transistors made in two distinct semiconductor levels as in claim 9 wherein the memory array is a static random access memory (SRAM) array.

11. The plurality of transistors made in two distinct semiconductor levels as in claim 10 wherein cells of the SRAM arrays have two p-type metal oxide semiconductor (PMOS) load transistors made in the thin film Si level located above four n-type metal oxide semiconductor (NMOS) driver transistors made in the bulk Si level.

* * * * *